United States Patent [19]

Templeton, Jr. et al.

[11] Patent Number: 5,519,201
[45] Date of Patent: May 21, 1996

[54] ELECTRICAL INTERCONNECTION FOR STRUCTURE INCLUDING ELECTRONIC AND/OR ELECTROMAGNETIC DEVICES

[75] Inventors: Thomas H. Templeton, Jr., Fremont; Charles F. Horejs, Jr., Morgan Hill, both of Calif.

[73] Assignee: US³, Inc., Santa Clara, Calif.

[21] Appl. No.: 235,820

[22] Filed: Apr. 29, 1994

[51] Int. Cl.⁶ .................................................. H05K 7/10
[52] U.S. Cl. ....................... 235/492; 29/832; 361/737; 439/66
[58] Field of Search .................. 439/66, 68, 74, 439/91, 76; 361/737, 760, 761, 763, 764; 235/488, 492; 29/830, 832, 842

[56] References Cited

U.S. PATENT DOCUMENTS

| | | | |
|---|---|---|---|
| 3,680,037 | 7/1972 | Nellis et al. | 439/66 |
| 3,702,464 | 11/1972 | Castrucci | 340/173 SP |
| 3,971,916 | 7/1976 | Moreno | 235/61.7 B |
| 4,338,621 | 7/1982 | Braun | 257/697 |
| 4,420,767 | 12/1983 | Hodge et al. | 439/71 |
| 4,539,622 | 9/1985 | Akasaki | 361/764 |
| 4,742,385 | 5/1988 | Kohmoto | 439/68 |
| 4,954,308 | 9/1990 | Yabe et al. | 264/272.17 |
| 4,960,983 | 10/1990 | Inoue | 235/488 |
| 5,018,051 | 5/1991 | Yamada et al. | 235/492 |
| 5,109,320 | 4/1992 | Bourdelaise et al. | 36/764 |

*Primary Examiner*—Neil Abrams
*Attorney, Agent, or Firm*—Skjerven, Morrill, MacPherson, Franklin & Friel; E. Eric Hoffman

[57] ABSTRACT

A flexible structure includes two or more electronic and/or electromagnetic devices, electrical connection being made between the devices by flexible and compressible electrically conductive plugs located within cavities or holes formed within the flexible structure. The structure is assembled so that the plugs are compressed between electrical contacts formed on or connected to the respective devices. As a result, good electrical contact is maintained between the devices. Additionally, if the structure is flexible, when the flexible structure is bent or deformed, the plugs bend or deform with the rest of the flexible structure so that the electrical connections between the plugs and the respective device electrical contacts are not broken.

12 Claims, 6 Drawing Sheets

ELECTRICAL INTERCONNECTION FOR STRUCTURE INCLUDING ELECTRONIC AND/OR ELECTROMAGNETIC DEVICES

BACKGROUND OF THE INVENTION

1. Field of the Invention

This invention relates to a flexible structure including electronic and/or electromagnetic devices and, in particular, to a contact structure for electrically connecting the devices so that electrical contact between the devices is maintained when the flexible structure is bent or otherwise deformed.

2. Related Art

There are a wide variety of applications that can make use of a flexible structure including electronic and/or electromagnetic devices, the devices being used for information input and output to and from the flexible structure, information processing and information storage. One example of such a flexible structure is a flexible identification card.

An identification card, as defined by the International Standards Organization (ISO) in ISO 7810, is "[a] card identifying its bearer and issuer which may carry data required as input for the intended use of the card and for transactions based thereon." Identification cards can have one of three nominal sizes (as specified in ISO 7810): 1) 3.370 inch (85.60 mm) width, 2.125 inch (53.98 mm) height, 0.030 inch (0.76 mm) thickness; 2) 4.134 inch (105 mm) width, 2.913 inch (74 mm) height, 0.030 inch (0.76 mm) thickness; 3) 4.921 inch (125 mm) width, 3.465 inch (88 mm) height, 0.030 inch (0.76 mm) thickness.

Some identification cards include an integrated circuit and are known as "integrated circuit cards" or "Smart Cards." More generally, herein, "Smart Card" refers to any portable card-like device which includes one or more electronic components, i.e., active components such as integrated circuits, transistors and diodes, and passive components such as resistors, capacitors and inductors. The integrated circuits can be formed on an integrated circuit chip and/or printed circuit board that is, in turn, attached to the main body of the Smart Card. Smart Cards can be used for a wide variety of applications such as prepaid "debit" cards (e.g., phone cards, transit passes, electronic purse), subscriber cards (e.g., bank ATM cards, credit cards, point-of-sale cards), loyalty scheme cards (e.g., frequent flier cards), security access and identification cards, health insurance and service cards (with optional protected memory), GSM (global system management for European Cellular Phones) cards and encryption/decryption cards.

Smart Cards are used with a reader/writer that includes an interface ("external interface") that is used to transmit information to or from the Smart Card. Some Smart Cards include electrical contacts which are used to make electrical connection between electrical circuitry on or within the Smart Card and the external interface. Other Smart Cards do not include electrical contacts and accomplish the transfer of information to and from the Smart Card through another means such as, for example, an inductive coil formed in or on the Smart Card that is used in combination with an external interface that produces and responds to an electromagnetic field, i.e., electromagnetic contact-less Smart Cards. Other types of contact-less cards use electro-static or capacitive coupling to accomplish the transfer of data and instructions to and from the card.

In Smart Cards (and other structures such as printed circuit boards, for example) including two or more electronic or electromagnetic devices, it is generally necessary or desirable to electrically interconnect the devices. Typically, in Smart Cards, this is done within the main body of the Smart Card. Electrical interconnection is made between electrical contacts on the respective devices, e.g., electrically conductive traces on a printed circuit board, electrically conductive bond pads on an integrated circuit chip, terminal points of an inductive coil.

In some previous flexible structures including two or more electronic or electromagnetic devices, electrical interconnection has been made between the devices by soldering or welding the respective electrical contacts together, or by attaching the respective electrical contacts with an electrically conductive adhesive. However, when the flexible structure is bent, the relatively rigid (as compared to the flexible structure) solder, weld or adhesive can break, resulting in failure or degradation of the electrical interconnection. Further, soldering or welding the respective electrical contacts together is a difficult task since it is difficult to position the soldering or welding equipment within a cavity formed in the main body of the card for placing one of the devices, e.g., an integrated circuit module. Additionally, most flexible Smart Cards (as well as many other flexible structures) are made of low temperature plastic which undesirably melts at the temperatures necessary for soldering, welding or heating an adhesive.

In other previous flexible structures including two or more electronic or electromagnetic devices, electrical interconnection has been made by forming holes through the main body of the card, the holes extending between the respective electrical contacts of the devices, then inserting copper "studs" into the holes which are attached at either end to the respective electrical contacts by soldering, welding or use of an electrically conductive adhesive. However, when the flexible structure bends, the rigid copper studs do not, so that, frequently, one or more of the copper studs break away from one or both of the electrical contacts, thereby breaking the electrical interconnection between the devices.

SUMMARY OF THE INVENTION

According to the invention, a structure includes two or more electronic and/or electromagnetic devices, electrical connection being made between the devices by flexible and compressible electrically conductive plugs located within cavities or holes formed within the flexible structure. The structure is assembled so that the plugs are compressed between electrical contacts formed on or connected to the respective devices. As a result, good electrical contact is maintained between the devices. Further, if the structure is a flexible structure, then, when the flexible structure is bent or deformed, the plugs bend or deform with the rest of the flexible structure so that the electrical connections between the plugs and the respective device electrical contacts are not broken.

Any number of electronic and/or electromagnetic devices can be included within the structure according to the invention, and the devices can be of any type such as an integrated circuit modules, transistors, diodes, and passive components such as resistors, inductors and capacitors. Further, an integrated circuit module for use with the invention can be a printed circuit board to which is attached one or more integrated circuit chips, a printed circuit board without an integrated circuit chip attached, or just an integrated circuit chip.

In one embodiment of the invention, the first device is an inductive coil supported by the main body of the structure and the second device is an integrated circuit module including an integrated circuit chip attached to a printed circuit board, bond pads on the chip being wirebonded to electrically conductive traces or regions on the printed circuit board.

The plugs can be made of any flexible, compressible, electrically conductive material or combination of materials. In one embodiment, each of the plugs are a "Fuzz Button," i.e., a metallic conductor formed as, for instance, a group of knotted strands ("Fuzz"), or a set of parallel filaments, springs or platelets, enclosed in an elastomeric material such as Shin Etsu's Polymer MAF.

In certain embodiments of the invention, the structure is a "Smart Card". However, the invention applies broadly to any structure including electrically interconnected devices, such as printed circuit boards, and is particularly useful in such structures that are flexible.

BRIEF DESCRIPTION OF THE DRAWINGS

FIGS. 2A, 2B and 2C are a plan view, a cross-sectional view taken along section B—B of FIG. 2A, and a cross-sectional view taken along section C—C of FIG. 2A, respectively, illustrating an inductive coil formed on a surface of a first substrate that is part of the main body of a contact-less integrated circuit card. FIGS. 2M, 2N and 2O are a plan view, a cross-sectional view taken along section N—N of FIG. 2M, and a cross-sectional view taken along section O—O of FIG. 2M, respectively, illustrating attachment of an integrated circuit module to the mounting surface of the second substrate so that electrical contact is made between the plugs and electrical contact points on the integrated circuit module.

DETAILED DESCRIPTION OF EMBODIMENTS OF THE INVENTION

According to the invention, a structure includes two or more electronic and/or electromagnetic devices, electrical connection being made between the devices by flexible and compressible electrically conductive plugs. The plugs are located within cavities or holes formed within the structure. The structure is assembled so that the plugs are compressed between electrical contacts formed on or connected to the respective devices.

Compression of the plugs results in a compressive force that pushes the plugs against the respective electrical contacts, thereby maintaining good electrical contact between the devices. Further, in structures according to the invention that are flexible, when the flexible structure is bent or otherwise deformed, the flexibility of the plugs allows the plugs to bend or deform with the rest of the flexible structure so that the electrical connections between the plugs and the respective device electrical contacts are not broken, thus preventing disablement of the electronic and/or electromagnetic capacity of the flexible structure.

Figure 1A:
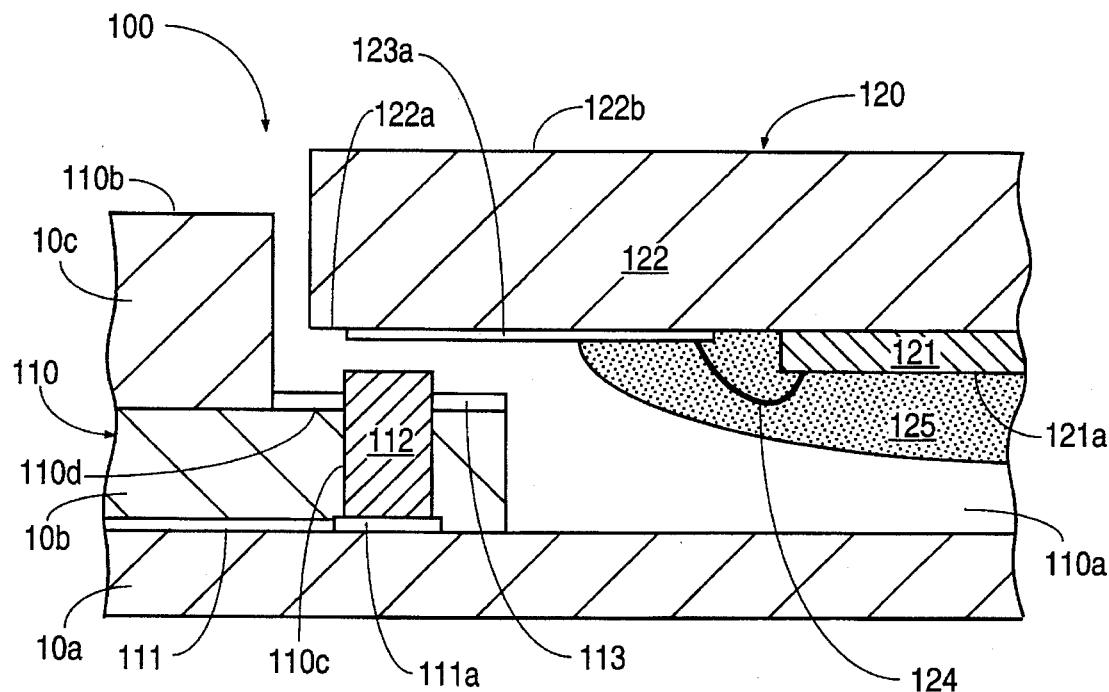
FIG. 1A is a cross-sectional view of a portion of a structure according to an embodiment of the invention just prior to attachment of an integrated circuit module to the main body of the structure.
Figure 1B:
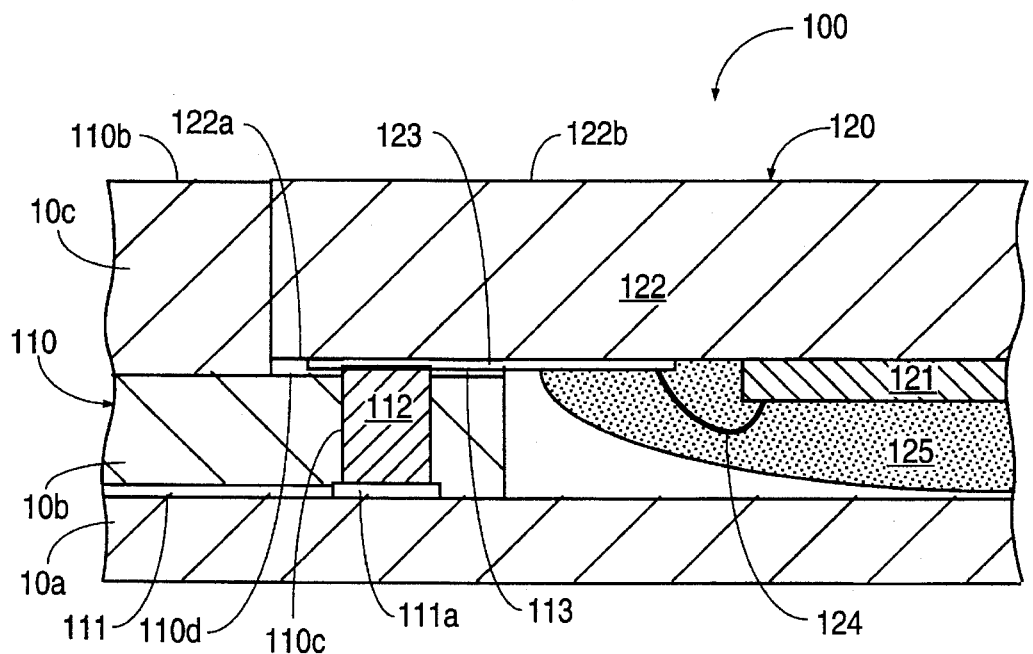
FIG. 1B is a cross-sectional view of the portion of the structure of FIG. 1A after attachment of the integrated circuit module to the main body of the structure.

FIG. 1A is a cross-sectional view of a portion of a structure 100 according to an embodiment of the invention just prior to attachment of an integrated circuit module 120 to a main body 110 of the structure 100. FIG. 1B is a cross-sectional view of a portion of the structure 100 of FIG. 1A after attachment of the integrated circuit module 120 to the main body 110 of the structure 100.

In structure 100, the integrated circuit module 120 is attached to the main body 110 which includes layers 10a, 10b and 10c, and an electrically conductive trace 111 (which may be an inductive coil). As described in more detail below in connection with FIGS. 2A–2O, layers 10a, 10b and 10c are attached with an adhesive and/or laminated. It is to be understood that this embodiment is merely illustrative and that a wide range of combinations of electronic and/or electromagnetic devices can be used in a structure according to the invention. A structure according to the invention can include any kind and number of electronic and electromagnetic devices (e.g., integrated circuit modules, transistors, diodes, and passive components such as resistors, inductors and capacitors).

Further, the integrated circuit module 120 of structure 100 includes an integrated circuit chip 121 attached to a printed circuit board 122. However, this need not be the case. An integrated circuit module for use with the invention could also be a printed circuit board without an integrated circuit chip attached, a printed circuit board with more than one integrated circuit chip attached, or just an integrated circuit chip.

The integrated circuit chip 121 is attached to the printed circuit board 122 using conventional techniques and adhesives. Electrically conductive traces 123 are formed on the printed circuit board 122 using conventional techniques. Any desired pattern of electrically conductive traces and electrically conductive regions (e.g., ground planes, power planes) can be formed on the surface 122a of the printed circuit board 122. The electrically conductive traces 123 (and electrically conductive regions, if present) are made of any conventional printed circuit board metallization material. Bond pads (not shown) are formed on the surface 121a of the integrated circuit chip 121. Each of selected ones of the bond pads are connected to a corresponding electrically conductive trace 123 by a bond wire 124 using conventional wirebonding techniques. The integrated circuit chip 121 is then encapsulated by a molding compound 125 by, for instance, potting.

The integrated circuit chip 121 can be attached to the printed circuit board 122 and electrically connected to the electrically conductive traces 123 other than as described above. For example, controlled collapse chip connection can be used to directly attach the bond pads of the integrated circuit chip 121 to the electrically conductive traces 123 of the printed circuit board 122 so that the surface 121a of the integrated circuit chip 121 is adjacent the surface 122a of the printed circuit board 122.

Additionally, the integrated circuit chip 121 can be attached to a leadframe or a set of leads on TAB tape and the leads attached to the main body 110.

The main body 110 is formed with a cavity 110a in which the integrated circuit module 120 fits such that the surface 122b of the printed circuit board 122 is substantially planar with the surface 110b of the main body 110 (see FIG. 1B) when the integrated circuit module 120 is attached to the main body 110. The electrically conductive trace 111 is formed of, for example, copper plated with nickel and gold, and has electrical contact pads 111a at terminal ends. The contact pads 111a are formed of, for example, copper plated with nickel and gold, and are positioned at locations that correspond to the locations of electrically conductive traces 123 on the printed circuit board 122. Each of a plurality of holes 110c are formed through the main body 110 to extend from one of the contact pads 111a to a mounting surface 110d of the main body 110. An adhesive 113 is formed on the mounting surface 110d so that the adhesive 113 does not cover the holes 110c. An electrically conductive plug 112 is placed within each hole 110c such that the plug 112 extends above the adhesive 113 (FIG. 1A) before attachment of the integrated circuit module 120 to the main body 110. Although only one conductive trace 111, contact pad 111a, hole 110c and conductive trace 123 are illustrated in FIGS. 1A and 1B, it will be appreciated that a plurality may be used, for example, as illustrated in FIGS. 2A through 2O.

As seen in FIG. 1B, when the integrated circuit module 120 is attached to the main body 110, the plugs 112 are compressed. (Though, in FIG. 1A, the plug 112 is shown as having the same diameter as the hole 110c, in practice, the plug 112 must have a slightly smaller diameter to accommodate the compression of the plug 112 which expands the plug 112 to increase the diameter of the plug 112.) The adhesive 113 holds the integrated circuit module 120 in place within the cavity 110a in the main body 110 so that the plugs 112 remain compressed after formation of the structure 100 is complete.

The plugs 112 are made of any flexible, compressible, electrically conductive material or combination of materials, as described in more detail below. Thus, compression of the plugs 112 causes a compressive force in the plugs 112 that presses the plugs 112 against the electrically conductive traces 123 and the contact pads 111a so that good electrical contact is maintained. Further, since the plugs 112 are made of an elastomeric material, if the structure 100 is flexible, when the structure 100 is bent or otherwise deformed, the plugs 112 bend or deform also, reducing stresses at the interface between the plug 112 and the electrically conductive trace 123, and the interface between the plug 112 and the contact pad 111a. Thus, bending of the structure 100 does not cause the plugs 112 to break away from either the electrically conductive traces 123 or the contact pads 111a, so that the electronic and/or electromagnetic functions of the structure 100 are not disabled.

Figure 2A:
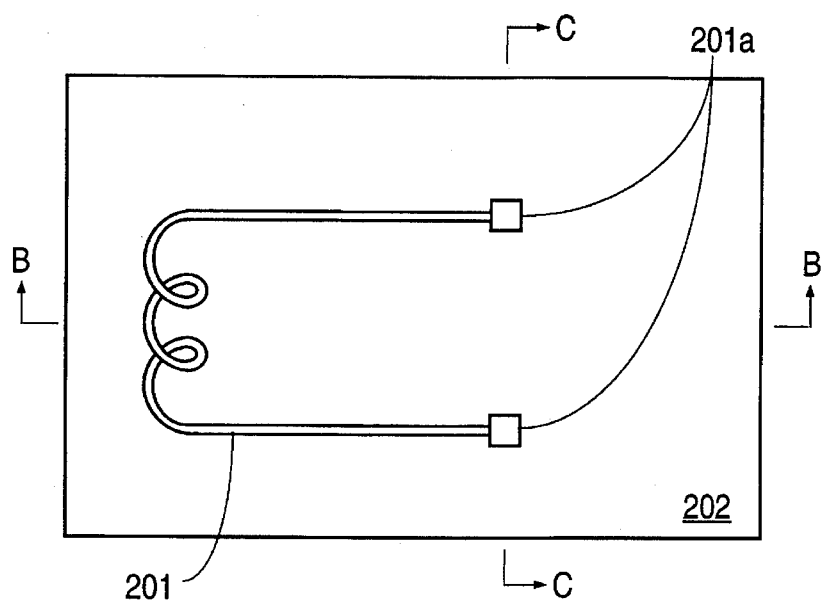
FIGS. 2A through 2O illustrate steps in a process for forming a contact-less integrated circuit card according to an embodiment of the invention.
Figure 2B:
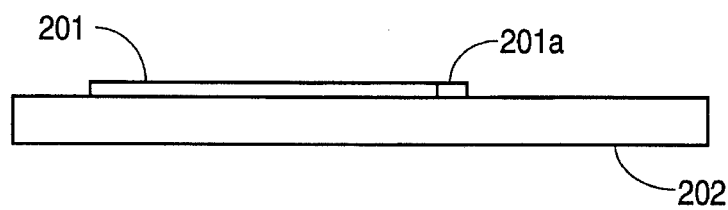
Figure 2C:
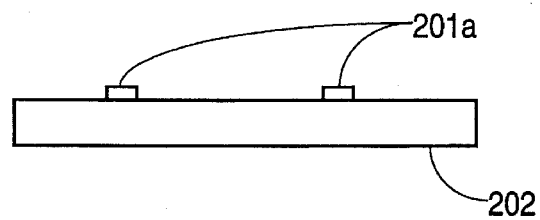
Figure 2D:
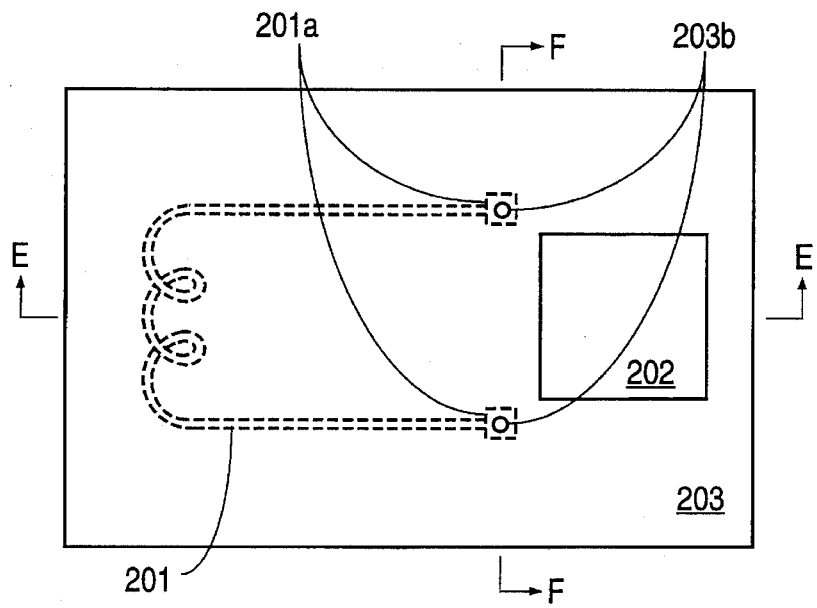
FIGS. 2D, 2E and 2F are a plan view, a cross-sectional view taken along section E—E of FIG. 2D, and a cross-sectional view taken along section F—F of FIG. 2D, respectively, illustrating a second substrate that is formed on the first substrate to cover the inductive coil.
Figure 2E:
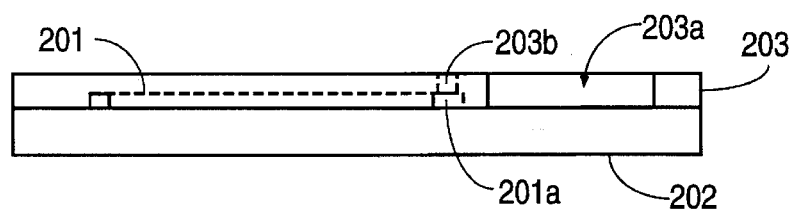
Figure 2F:
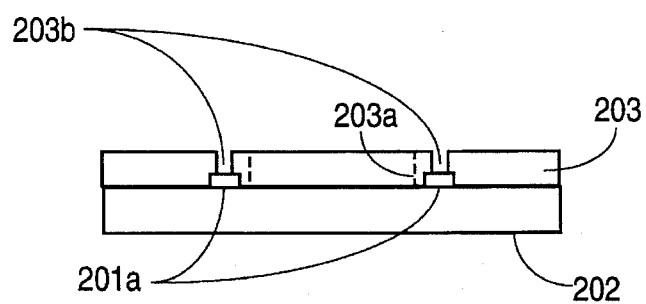
Figure 2G:
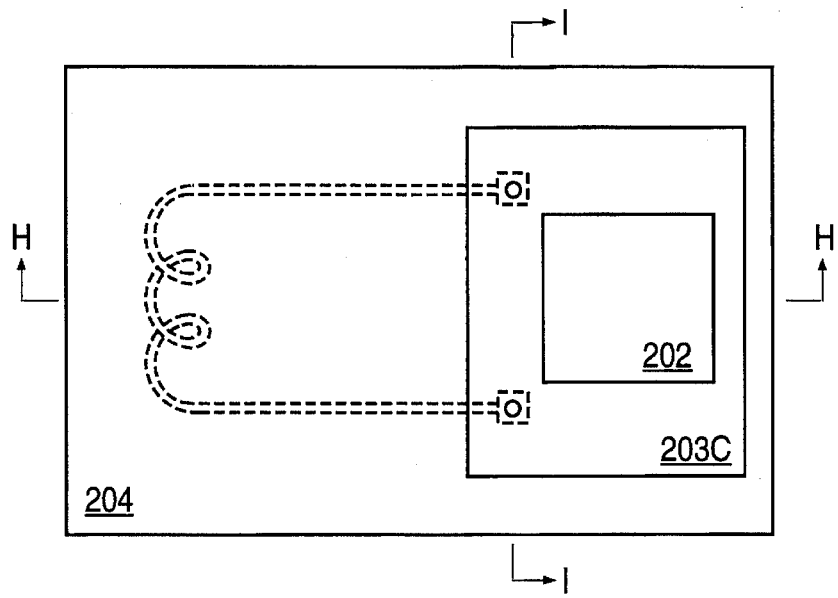
FIGS. 2G, 2H and 2I are a plan view, a cross-sectional view taken along section H—H of FIG. 2G, and a cross-sectional view taken along section I—I of FIG. 2G, respectively, illustrating a third substrate formed on the second substrate to define a mounting surface for an integrated circuit module on the second substrate.
Figure 2H:
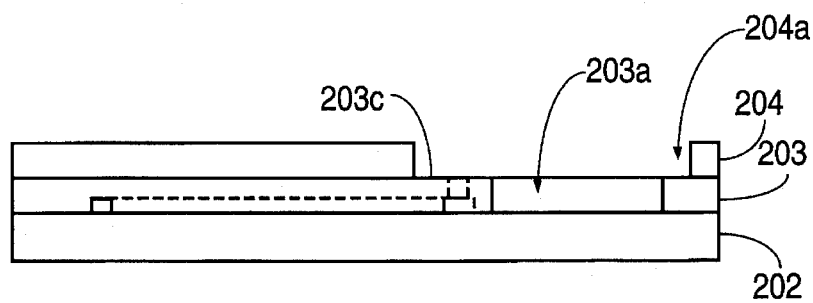
Figure 2I:
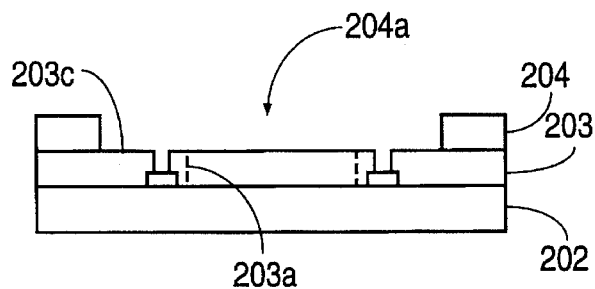
Figure 2J:
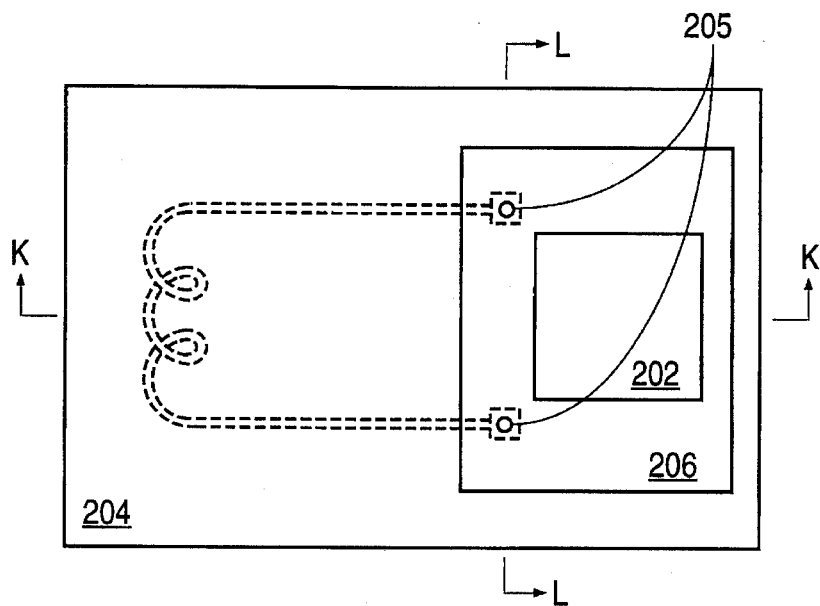
FIGS. 2J, 2K and 2L are a plan view, a cross-sectional view taken along section K—K of FIG. 2J, and a cross-sectional view taken along section L—L of FIG. 2J, respectively, illustrating flexible, compressible electrically conductive plugs inserted in contact holes formed through the second substrate and an adhesive formed on the mounting surface of the second substrate.
Figure 2K:
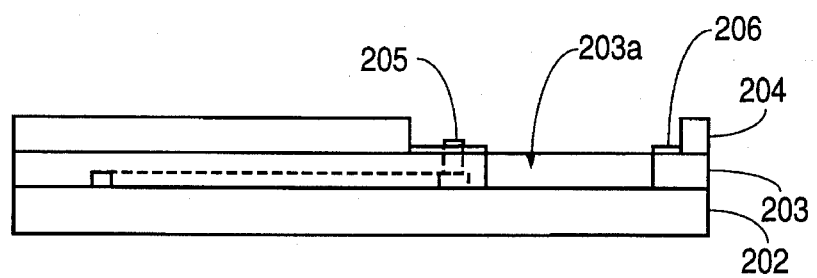
Figure 2L:
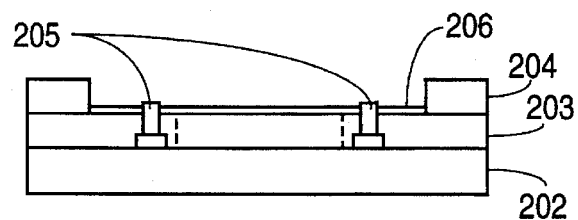
Figure 2M:
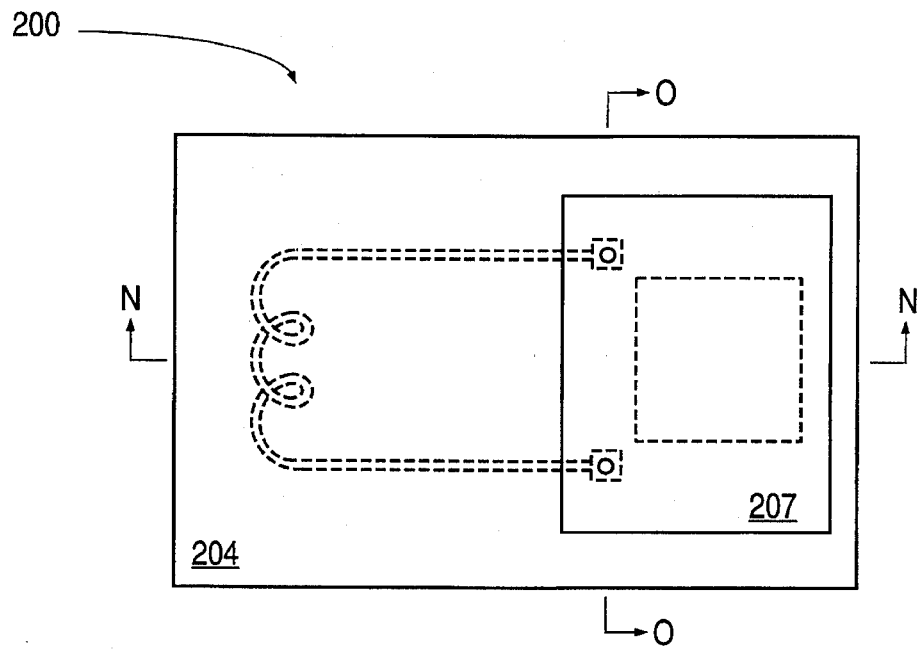
Figure 2N:
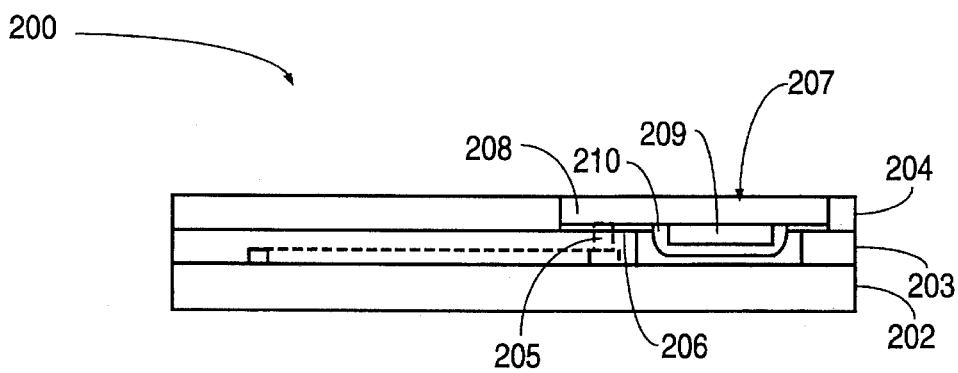
Figure 2O:
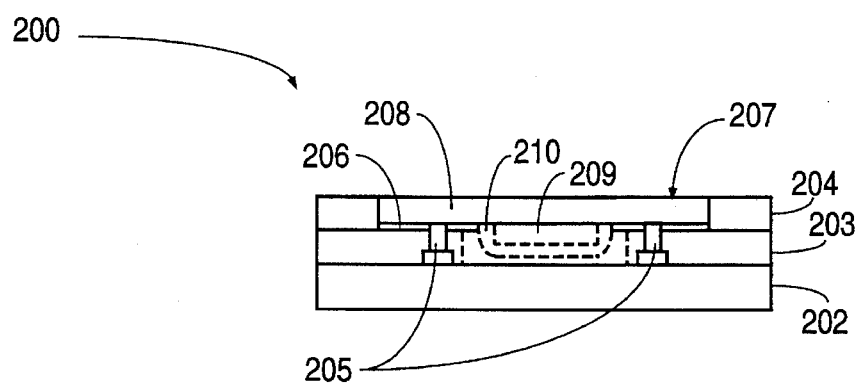

FIGS. 2A through 2O illustrate steps in a process for forming an electromagnetic contact-less integrated circuit card according to an embodiment of the invention. However, it is to be understood that the invention is applicable to any type of structure including two or more electronic and/or electromagnetic devices and that the process described is merely illustrative of the possible processes for forming a structure according to the invention.

FIGS. 2A, 2B and 2C are a plan view, a cross-sectional view taken along section B—B of FIG. 2A, and a cross-sectional view taken along section C—C of FIG. 2A, respectively, illustrating an inductive coil 201 formed on a surface of a first substrate 202 that is part of the main body of an electromagnetic contact-less integrated circuit card. In FIGS. 2A, 2B, 2C (and FIGS. 2D through 2O below), for simplicity, the inductive coil 201 is shown schematically using the well known symbol for an inductor. It is to be understood that, in reality, the inductive coil 201 can be formed in any appropriate shape. In one embodiment, the inductive coil 201 is formed as a spiral. The spiral is formed in three dimensions such that the outer "end" of the spiral and the inner "end" of the spiral are in different planes so that the inner "end" of the spiral can be extended to a contact pad (described in more detail below) located outside of the outermost turn of the spiral.

The first substrate 202 is formed of any suitable material. In embodiments in which the structure according to the invention is flexible, the first substrate 202 is formed of one or more layers of a flexible material such as, for example, poly-vinyl-chloride, polyimide, FR4 (fiberglass), bituminous resin, polysulfone, polycarbonate or ABS (acrylonitrile-butadiene-styrene). If desired, different materials can be used for different layers of the substrate 202. The number and types of materials of layers included in the first substrate 202 (and the other substrates described below) depends upon the manufacturing techniques used, the characteristics of the material being used and the mechanical performance requirements of the electromagnetic contact-less integrated circuit card.

If more than one layer is used for the first substrate 202, preferably, the layers are attached with adhesives and then laminated (i.e., fused together under heat and pressure to form a unitary structure). Any of a number of different adhesives can be used, such as rubber-based adhesives, solvent and latex based adhesives, thermoplastic hot melt, iscoyanate-based adhesives, PUR (polyurethanes), epoxy resin, polysulfide sealants and adhesives, reactive acrylate-based adhesives, cyanoacrylates and silicones. However, the layers need not be laminated and can be attached only with adhesives. Alternatively, if the layers are laminated, the layers need not be first attached with an adhesive.

The inductive coil 201 is formed in or on the surface of the first substrate 202 with a shape and of a material determined according to principles well-known in the art of coil forming. For example, inductive coil 201 can be formed in a spiral, as described above, of any desired electrically conductive material such as, for example, copper. Inductive coil 201 is formed using any of a number of conventional processes and equipment that are well known in the art of coil forming. For example, inductive coil 201 can be formed using conventional lithographic techniques.

The contact pads 201a are formed at terminal ends of the inductive coil 201. The contact pads 201a can be formed by, for example, stamping the terminal ends of inductive coil 201. Alternatively, contact pads 201a can be attached to the terminal ends of inductive coil 201 by, for example, spot welding or soldering. The contact pads 201a can be made of, for example, copper, stainless steel, nickel or brass. The contact pads 201a can be plated with gold, if desired.

FIGS. 2D, 2E and 2F are a plan view, a cross-sectional view taken along section E—E of FIG. 2D, and a cross-sectional view taken along section F—F of FIG. 2D, respectively, illustrating a second substrate 203 that is formed on the first substrate 202 to cover the inductive coil 201. Like the first substrate 202, the second substrate 203 can include one or more layers. The layers of the second substrate 203 are made of materials as described above and can be different from each other and/or different from the layers of the first substrate 202. The second substrate 203 is attached to the first substrate 202 with an adhesive and laminated, just attached with an adhesive, or just laminated.

Contact holes 203b are formed through the second substrate 203 at locations that correspond to the location of the contact pads 201a of the inductive coil 201. A cavity hole 203a into which an integrated circuit module will be positioned is also formed through the second substrate 203. The contact holes 203b and cavity hole 203a can be formed either before or after attaching the second substrate 203 to the first substrate 202. The contact holes 203b and cavity hole 203a can be formed by, for instance, punching, stamping, chemical etching, mechanical or laser drilling, or milling.

FIGS. 2G, 2H and 2I are a plan view, a cross-sectional view taken along section H—H of FIG. 2G, and a cross-sectional view taken along section I—I of FIG. 2G, respectively, illustrating a third substrate 204 formed on the second substrate 203 to define a mounting surface 203c for an integrated circuit module on the second substrate 203. Like the first substrate 202 and second substrate 203, the third substrate 204 can include one or more layers. The layers of the third substrate 204 are made of materials as described above and can be different from each other and/or different from the layers of the first substrate 202 and/or second substrate 203. The third substrate 204 is attached to the second substrate 203 with an adhesive and laminated, just attached with an adhesive, or just laminated.

A cavity hole 204a is formed through the third substrate 204 at a location such that, when the third substrate 204 is attached to the second substrate 203, the cavity hole 204a defines a shelf 203c on a surface of the second substrate 203 that surrounds the cavity hole 203a formed through the second substrate 203. The cavity hole 204a can be formed either before or after attaching the third substrate 204 to the second substrate 203. The cavity hole 204a can be formed by, for instance, punching, stamping, chemical etching, mechanical or laser drilling, or milling.

FIGS. 2J, 2K and 2L are a plan view, a cross-sectional view taken along section K—K of FIG. 2J, and a cross-sectional view taken along section J—J of FIG. 2J, respectively, illustrating flexible, compressible electrically conductive plugs 205 inserted in the contact holes 203b and an adhesive 206 formed on the mounting surface 203c of the second substrate 204. Insertion of the plugs 205 into the contact holes 203b and formation of the adhesive 206 on the mounting surface 203c can occur in any order. In another embodiment of the invention, an electrically conductive adhesive is formed on opposite ends of the plugs 205 to help adhere the plugs 205 to the contact pads 201a and to electrical contact points formed on the integrated circuit module 207 (discussed in more detail below).

The adhesive 206 can be a liquid glue, e.g., a cyanoacrylic glue such as Locktite, which is dispensed on to mounting surface 203c using conventional equipment and processes. The glue dispensing equipment is controlled (either manually or by computer-controlled robotic dispenser) so that glue does not enter the contact holes 203b (if the adhesive 206 is formed before insertion of the plugs 205) or contact the plugs 205 (if the adhesive 206 is formed after insertion of the plugs 205).

Alternatively, adhesive 206 can be a solid material, e.g., double-sided sticky tape. The solid material is patterned with holes and a cavity that correspond to the contact holes 203b and cavity 203a, then adhered to mounting surface 203c.

Or, adhesive 206 can be a thermosetting resin such as epoxy resin. The thermosetting resin can be patterned with holes and a cavity, as above, and placed on mounting surface 203c, or the thermosetting resin can be dispensed on to mounting surface 203c. The thermosetting resin is then heated and cooled after the integrated circuit module is placed within cavities 203a and 204a, as explained below.

The plugs 205 are placed either robotically or manually in the contact holes 203b using conventional tools and processes. In the electromagnetic contact-less integrated circuit card according to the invention shown in FIGS. 2A through 2O, there are two contact holes 203b and plugs 205, one at each terminal end of the inductive coil 201. However, it is to be understood that in other embodiments of a structure according to the invention including other types or quantities of electronic or electromagnetic devices, a lesser or greater number of contact holes 203b and plugs 205 can be formed. Further, even in the electromagnetic contact-less integrated circuit card shown in FIGS. 2A through 2O, it is possible and perhaps desirable to form additional, redundant sets of contact pads 201a, contact holes 203b and plugs 205 to increase the reliability of the electromagnetic contact-less integrated circuit card.

The plugs 205 and contact holes 203b are shown in FIGS. 2D through 2O as having a circular cylindrical shape. However, cylindrical shapes having other cross-sectional shapes, e.g., rectangular, can be used. The height of the plugs 205 is chosen to be slightly greater than the combined thickness of the second substrate 203 and the adhesive 206, so that when the integrated circuit module is attached, as explained below, the plugs 205 are compressed. Further, the cross-sectional dimensions of the plugs 205, e.g., diameter, or width and length, are made slightly smaller than the corresponding dimensions of the contact holes 203b so that, when the plugs 205 are compressed, there is room within the contact holes 203b for the plugs 205 to expand.

As noted above, the plugs 205 can be formed of any flexible, compressible, electrically conductive material or combination of materials. In one embodiment, the plugs 205 are made of an anisotropically electrically conductive elastomeric material. In a further embodiment, the plugs 205 are a metallic conductor enclosed in an elastomeric material such as, for example, an intrinsically conductive polymer (ICP). The metallic conductor is, for instance, a group of knotted strands, or a set of parallel filaments, springs or platelets. The plugs 205 according to this embodiment of the invention are either molded, extruded and cut, or die punched. Plugs 205 according to this embodiment of the invention are commercially available as "Fuzz Buttons" from Trw/Cinch located in Elk Grove Village, Ill. Plugs 205 can also be polymer MAF available from Shin Etsu Polymer America located in Union City, Calif. Whatever material is used for plugs 205, it is necessary or desirable to specify certain characteristics of plugs 205: electrical properties such as, for example, resistance and, where appropriate, inductance; geometric dimensions; and mechanical properties such as, for example, spring constant.

FIGS. 2M, 2N and 2O are a plan view, a cross-sectional view taken along section N—N of FIG. 2M, and a cross-sectional view taken along section O—O of FIG. 2M, respectively, illustrating attachment of an integrated circuit module 207 to the mounting surface 203b of the second substrate 203 so that electrical contact is made between the plugs 205 and electrical contact points (not shown) on the integrated circuit module 207. The electrical contact points can be either a portion of an electrically conductive trace, or an electrically conductive contact pad formed at the end of an electrically conductive trace. Attachment of the integrated circuit module 207 completes formation of the electromagnetic contact-less integrated circuit card 200.

The integrated circuit module 207 includes a conventional integrated circuit chip 209 attached to a conventional printed circuit board 208 (e.g., an FR4 printed circuit board with metallization made of copper plated with nickel and gold) and enclosed by an encapsulant 210. The integrated circuit chip 209 is attached to the printed circuit board 208 using conventional adhesives. Bond pads (not shown) on the integrated circuit chip 209 are electrically connected with bond wires (not shown) to electrically conductive traces and/or regions formed on a surface of the printed circuit board 208 using conventional wirebonding techniques. The encapsulant 210 is formed by potting to enclose the integrated circuit chip 209 and bond wires. However, note that formation of encapsulant 210 is not absolutely necessary and, in other embodiments of the invention, the encapsulant 210 is not present.

The integrated circuit module 207 is positioned within the cavities 203a and 204a on the adhesive 206, either manually or robotically using conventional equipment and processes, so that each of the electrical contact points on the printed circuit board 208 contacts a corresponding one of the plugs 205. Pressure is applied to the integrated circuit module 207 so that the plugs 205 are compressed. If a thermosetting resin is used as adhesive 206, the resin is heated and then cooled while the pressure is applied. The adhesive 206 holds the integrated circuit module 207 in place, keeping the plugs 205 compressed so that good electrical contact is maintained between each of the plugs 205 and the corresponding contact pad 201a and electrical contact point of the printed circuit board 208.

In embodiments of a structure according to the invention other than that shown in FIGS. 2A through 2O, electrically conductive circuitry and regions can be formed in any desired pattern according to well known techniques on one or more of the layers of the main body. Vias may also be formed according to well known techniques through one or more layers of the main body to electrically connect electrically conductive material formed on different layers of the main body.

Various embodiments of the invention have been described. The descriptions are intended to be illustrative, not limitative. Thus, it will be apparent to one skilled in the art that certain modifications may be made to the invention as described without departing from the scope of the claims set out below.

I claim:

1. A smart card comprising:

a first flexible layer;

a first electrical contact located over a first surface of the first layer;

a first electronic or electromagnetic device for controlling said smart card disposed on the first layer, wherein the first electrical contact is coupled to the first device;

a second flexible layer located over the first surface of the first layer and the first electrical contact, the second layer having an opening which extends through the second layer to expose the first electrical contact, and wherein a cavity is formed in the second layer;

a third layer located over the second layer;

a second electrical contact located over the third layer, the second and third layers being positioned such that the second electrical contact is disposed between the second and third layers, and over the opening;

a second electronic or electromagnetic device for controlling said smart card disposed on the third layer, wherein the second electrical contact is coupled to the second device, and wherein the second device is disposed in the cavity in the second layer; and a flexible, compressible electrically conductive plug located within the opening, the plug being compressed between the first electrical contact and the second electrical contact to make electrical connection therebetween.

2. The smart card of claim 1, wherein the second device is an integrated circuit module.

3. Structure as in claim 2, wherein the integrated circuit module further comprises an integrated circuit chip.

4. The smart card of claim 3, wherein the third layer comprises a printed circuit board.

5. The smart card of claim 4 further comprising:

an electrically conductive trace located on a surface of the printed circuit board, wherein the trace is electrically connected to the second electrical contact;

an electrically conductive bond pad located on a surface of the integrated circuit chip; and means for electrically connecting the bond pad to the trace on the printed circuit board.

6. The smart card of claim 2, wherein the first device is an inductive coil fabricated over the first surface of the first layer.

7. The smart card of claim 1, wherein the plug is made of an anisotropically electrically conductive elastomeric material.

8. The smart card of claim 7, wherein the plug is a fuzz button.

9. The smart card of claim 1, further comprising a flexible fourth layer located over the second layer, wherein the fourth layer has an opening which laterally surrounds said third layer.

10. A method for constructing a smart card, the method comprising the steps of:

providing a first flexible layer;

forming a first electrically conductive trace over a first surface of the first flexible layer, the first trace having a first electrical contact;

affixing a first electronic or electromagnetic device over the first surface of the first layer, whereby the first device is coupled to the first trace;

providing a second flexible layer;

forming an opening through the second flexible layer;

forming an cavity in the second flexible layer;

placing an flexible, compressible, electrically conductive plug in the opening;

affixing the second layer to the first layer such that the opening is aligned with the first electrical contact;

providing a third layer;

forming a second electrically conductive trace over a second surface of the third layer, the second trace having a second electrical contact;

affixing a second electronic or electromagnetic device over the second surface of the third layer, whereby the second device is coupled to the second trace;

affixing the third layer to the second layer, such that the opening is aligned with the second electrical contact, the second device is disposed in the cavity, and the plug is compressed between the first and second electrical contacts.

11. A method as in claim 10, wherein the first device comprises an inductive coil.

12. A method as in claim 10, wherein the the second device is an integrated circuit module.

* * * * *